US012742236B2

(12) United States Patent
Wang et al.

(10) Patent No.: US 12,742,236 B2
(45) Date of Patent: Sep. 22, 2026

(54) SURFACE PRE-OXIDIZED AlCrVTiSiON NANO-GRADIENT COATING AND PREPARATION METHOD THEREOF

(71) Applicant: Tianjin University of Technology and Education, Tianjin City (CN)

(72) Inventors: Tiegang Wang, Tianjin City (CN); Rui Zhang, Tianjin City (CN); Mengjiao Xu, Tianjin City (CN); Yanmei Liu, Tianjin City (CN); Bing Yan, Tianjin City (CN)

( * ) Notice: Subject to any disclaimer, the term of this patent is extended or adjusted under 35 U.S.C. 154(b) by 0 days.

(21) Appl. No.: 19/017,715

(22) Filed: Jan. 12, 2025

(65) Prior Publication Data

US 2025/0146124 A1 May 8, 2025

(51) Int. Cl.

*C23C 14/32* (2006.01)
*C23C 14/02* (2006.01)
*C23C 14/06* (2006.01)
*C23C 14/50* (2006.01)

(52) U.S. Cl.

CPC ............ *C23C 14/32* (2013.01); *C23C 14/022* (2013.01); *C23C 14/025* (2013.01); *C23C 14/0688* (2013.01); *C23C 14/505* (2013.01)

(58) Field of Classification Search

CPC ..... C23C 14/32; C23C 14/022; C23C 14/025; C23C 14/0688; C23C 14/505; C23C 14/024; C23C 14/0021; C23C 14/0641; C23C 14/325; C23C 14/06; C23C 14/54; C23C 14/5853

USPC ........................................ 204/192.38, 298.41

See application file for complete search history.

(56) References Cited

FOREIGN PATENT DOCUMENTS

| | | | | |
|---|---|---|---|---|
| CN | 111647856 A * | 9/2020 | ........... | C23C 14/325 |
| CN | 111549322 B * | 8/2022 | ............. | C23C 14/54 |
| WO | WO-2019128904 A1 * | 7/2019 | ........... | C23C 30/005 |

OTHER PUBLICATIONS

Machine Translation CN-111549322-B (Year: 2022).*
Machine Translation WO-2019128904-A1 (Year: 2019).*
Machine Translation CN-111647856-A (Year: 2020).*

* cited by examiner

*Primary Examiner* — Rodney G Mcdonald

(57) ABSTRACT

The invention discloses an AlCrVTiSiON nano-gradient coating with surface pre-oxidation and a preparation method thereof, belonging to the technical field of coatings. The AlCrVTiSiON nano gradient coating is prepared by arc ion plating technology, wherein the target materials are selected from metal Cr target, V target, AlCrSi target and AlTiSi target. In order to further improve the heat resistance of the coating and increase the cutting amount during service, the AlCrVTiSiON nano-gradient coating with O element content increasing from inside to outside was formed. The prepared coating has good heat resistance, which is suitable for high-speed cutting and improves processing efficiency.

5 Claims, 9 Drawing Sheets

SURFACE PRE-OXIDIZED AlCrVTiSiON NANO-GRADIENT COATING AND PREPARATION METHOD THEREOF

TECHNICAL FIELD

The invention relates to the technical field of coatings, in particular to an AlCrVTiSiON nano-gradient coatings with surface pre-oxidation and a preparation method thereof.

BACKGROUND

Coatings with face-centered cubic structures have the characteristics of high hardness, high wear resistance and excellent thermal stability, and are widely used in industrial processing fields. Such coatings are formed with nitrogen oxide surface coatings by adding oxygen, which has better oxidation resistance than the nitride coating. However, excessive doping of O elements can lead to the formation of amorphous oxide phases and lead to a sharp decline in mechanical properties. Vanadium reacts easily with Oxygen to form $V_2O_5$, which has low shear strength at high temperatures and can be used as a solid lubricant. These oxides can significantly enhance the oxidation resistance of the coating at high temperatures. However, lubricant oxide coatings cannot be directly used as protective coatings in mechanical applications, and most research has focused on adding oxide forming elements to hard metal nitride coatings, aiming to achieve a low coefficient of friction while maintaining the hardness of the coating. Vanadium oxide is one of the most studied lubricating oxides, especially the rhombic $\alpha$-$V_2O_5$, which has a stable crystal structure. In addition, Al and Cr in the coating can also improve the oxidation resistance of the coating, but only when the a phase aluminum chromium oxide structure is generated in the coating can effectively prevent high-temperature oxidation, and improve the wear resistance of the coating, thereby extending the service life of the coating tool. These $\alpha$-(Al, Cr)$_2O_3$ based coatings are able to withstand extremely high temperatures during dry milling of high-strength materials while exhibiting high wear resistance.

Doped Oxygen can lead to the formation of an amorphous oxide phase, reduce the friction coefficient of coating, improve the wear resistance, and affect the mechanical properties of coating. The introduction of oxygen elements into AlCrN coatings lead to formation of a dense $Al_2O_3$ film on the surface of the coating, which can serve a better protective role, and can prevent the growth of micro-cracks. Since most AlCrN-based coatings are prepared by arc ion plating technology, and the deposition rate of arc equipment is too high; thus, it is easy to form highly brittle $TiO_2$ layer if oxygen element is introduced into Ti coating, which deteriorates the coating performance. At present, the research of oxygen doping on the oxidation resistance of coatings mainly focuses on the effect of O content levels. Higher oxygen concentrations result in more oxygen-holding defects, such as stacking faults and polytypic compounds described as octahedral coordination clusters of aluminum atoms. In addition, compared with the single coating, multi-layer composite coatings can not only combine the strengthening mechanism of single coatings, but also the improved structural regulation and better strengthening mechanisms of multi-layer coatings.

At present, there are few reports on the research of oxide layer thickness. The invention aims at the AlCrVTiSiN coating, which is pre-oxidized by oxygen for different times at the end of deposition, so as to study the study of AlCrVTiSiN/AlCrVTiSiON double layer coating with different oxide layer thickness. AlCrVTiSiN/AlCrVTiSiON gradient coatings with different oxide thickness were prepared by changing the oxygen passing time on the coating surface by arc ion plating technique. The effects of oxide thickness on the composition, phase composition, microstructure, mechanical properties and tribological behavior of AlCrVTiSiN coating were studied.

SUMMARY

In order to further improve the thermal stability and oxidation resistance of existing uniform composition AlCrVTiSiN coatings, the invention aims to provide a surface pre-oxidizing AlCrVTiSiON nano-gradient coating and a preparation method thereof. By adopting arc ion plating technology, the surface of a AlCrVTiSiN gradient coating with varying Vanadium content is further pre-oxidized. AlCrVTiSiON gradient coatings with high hardness, high wear resistance and high oxidation resistance were prepared by controlling the content of V and the time of oxygenation.

To realize the above purpose, the technical scheme adopted by the invention is as follows:

A surface-pre-oxidized AlCrVTiSiON nano-gradient coating deposited on a metal (carbide substrate or stainless steel sheet) or silicon substrate, the coating gradually increases the content of the element O from the inside to the outside, and the coating surface is covered with an AlCrVTiSiON oxide protective layer. Due to the pre-oxidation of the coating surface, the oxidation resistance and thermal stability of the coating are improved.

A CrN transition layer is formed between the AlCrVTiSiON coating and the substrate, and the AlCrVTiSiN functional layer is deposited on the CrN transition layer and then pre-oxidized to obtain the AlCrVTiSiON nano-gradient coating. The total thickness of the nano-gradient coating is controlled in the range of 2~5 μm.

The AlCrVTiSiON nano-gradient coating comprises fcc-(Al, Cr, V) N phase, fcc-TiO phase, hcp-$Cr_2N$ phase, bcc-TiVN phase and a small amount of amorphous phase.

The hardness and elastic modulus of the AlCrVTiSiON nano-gradient coating can reach up to 28.0 GPa and 405.3 GPa, and the maximum values of H/E and $H^3/E^{*2}$ can reach 0.069 and 0.111 GPa, at which time the critical load of the coating is 55.2 N.

In the AlCrVTiSiON nano-gradient coating, the content of V element is 19.0-27.0 wt. %, the content of O element is 8.5-24.0 wt. %, and the content of O element in the surface layer of the coating is 20.0-24.0 wt. %.

The AlCrVTiSiON nano-gradient coating is deposited on the substrate by arc ion plating technology, and the change of V content is controlled by linear adjustment of the V target current, and the AlCrVTiSiON nano-gradient coating is formed by pre-oxidation on the coating surface. Wherein the target materials are selected from: AlCrSi, AlTiSi alloys and metal V target and Cr target; The transition layer of metal compound CrN was deposited on the substrate for 15~20 min, and then the functional layer of AlCrVTiSiN was deposited and pre-oxidized. During the deposition of AlCrVTiSiN functional layer and pre-oxidation, the background vacuum is above 3×10-3 Pa, the bias is −100~-110 V (duty cycle 50%~60%), the deposition pressure is 2.8-2.9 Pa, the AlCrSi target, AlTiSi target and V target are opened, and the alloy target current is kept constant. AlCrSi target current range is 95-100 A, AlTiSi target current range is 80-85 A; The V target current increases linearly from the lower limit of 75 A to the upper limit of 80-95 A, through Ar and $N_2$. According to the thickness of the required gradient coating and the target current, the opening time of the target material and the gas inlet time are set, and oxygen is injected into the coating within 5-20 min of the last deposition to implement pre-oxidation to form AlCrVTiSiON nanogradient coating.

Further, when the AlCrVTiSiN and AlCrVTiSiON layers are deposited, the flow rate into Ar is 50-60 sccm, the flow rate into $N_2$ is 590-600 sccm, the total gas flow rate is 650 sccm, and the bias is −100~−110 V.

Preferably, in the process of deposition of AlCrVTiSiON protective layer, the gas flow rate of oxygen is 10-15 sccm, and the adjustment range of oxygen passage time is preferably 5-12 min.

Furthermore, in the process of preparing AlCrVTiSiON nano-gradient coating, the hardness and elastic modulus of the coating first increase and then decrease with the increase of oxygenation time, and the friction coefficient and wear of the coating first decrease and then increase.

The preparation of the AlCrVTiSiON nano-gradient coating specifically includes the following steps:

(1) The cleaned substrate is fixed on the rotating frame in the coating room, and the vacuum degree is pumped to more than $3\times10^{-3}$ Pa; AlCrSi, AlTiSi alloy targets, metal V targets, Cr targets are used as arc ion plating cathode targets;

(2) The substrate was cleaned by glow discharge and ion bombardment successively. The process of glow discharge cleaning is as follows: through Ar, Ar gas flow is set to 400-410 sccm, the working pressure is adjusted to 2.4-2.5 Pa, the pulse bias is set to −800~−750 V (duty cycle 94-96%), and the glow time is 15-20 min; The ion bombardment cleaning process is as follows: after glow discharge cleaning, first turn off the bias, then set the Ar gas flow rate to 100-110 sccm, adjust the working pressure to keep at 0.5-0.6 Pa, open the Cr target, and the Cr target current is 90-95 A; When the pulse bias voltages are −800 V, −600 V, −400 V and −200 V (duty cycle 94-96%), wash for 2 minutes each.

(3) The CrN transition layer is deposited to improve the bonding strength between the working layer and the substrate. The deposition process of the CrN transition layer is as follows: Turn off the target power supply and bias voltage successively, open the $N_2$ gas cylinder, the argon gas flow rate is 50-60 sccm and the nitrogen gas flow rate is 190-200 sccm, the working pressure is adjusted to maintain 1.0-1.1 Pa, the pulse bias voltage is −100~−90 V (duty ratio 60%), the Cr target is opened and the CrN transition layer is deposition, and the Cr target current is 90-95 A. The deposition time is 15-20 min.

(4) AlCrVTiSiN functional layer was deposited (5) Deposition of AlCrVTiSiON protective layer.

The design mechanism of the invention is as follows:

The invention adopts arc ion plating technology to deposit AlCrVTiSiON nano-gradient coating on cemented carbide sheet, SUS 304 stainless steel and single crystal Si sheet. The V element in the coating reacts in varying degrees, with the O element gradually increasing from inside to outside.

Although AlCrVTiSiN coating has good mechanical properties and wear resistance, its thermal stability is poor, which limits its application in high-speed machining of difficult workpieces. In order to further improve the heat resistance of the coating and increase the cutting amount during service, the AlCrVTiSiON nano-gradient coating was formed by pre-oxidation on the surface of the coating. By changing the oxygenation time of the coating surface (oxygenation time range: 5 min-20 min), an oxide protective layer is formed on the coating surface to enhance the thermal stability of the coating. The total thickness of the coating is controlled at 2~5 μm. The present invention studies the influence of process parameters such as oxide layer thickness on coating components, mechanical properties and tribological behavior to obtain the rules of their influence on coating performance. By changing parameters such as the oxygenation time on the coating surface, the oxide layer on the surface of the prepared AlCrVTiSiON nano-gradient coating has an excellent protective effect. Compared with the AlCrVTiSiN coating, the wear resistance of the coating is greatly improved, and the oxidation resistance and thermal stability are significantly enhanced, and the prepared AlCrVTiSiON gradient coating can have better wear resistance and high temperature oxidation resistance.

The advantages and beneficial effects of the invention are as follows:

1. The AlCrVTiSiON gradient coating prepared by the invention has excellent wear resistance, obvious anti-wear effect, and excellent oxidation resistance at high temperature and thermal stability.

2. The AlCrVTiSiON coating is preoxidized on the surface of the coating on the basis of the AlCrVTiSiN coating with a certain change in V content, and the obtained AlCrVTiSiON nano-gradient coating has the advantages of high oxidation resistance, thermal stability, high wear resistance, etc.

3. The AlCrVTiSiON gradient coating of the invention has a wide range of application prospects, is suitable for high-speed dry cutting of various difficult materials, greatly improves cutting efficiency, and prolongates the service life of cutting tools.

4. The AlCrVTiSiON gradient coating of the invention has excellent high temperature and oxidation resistance, thermal stability, mechanical properties and friction and wear properties, and the coating tool can be applied to high-speed cutting continuous heavy-duty machining.

DETAILED DESCRIPTION

Figure 1:
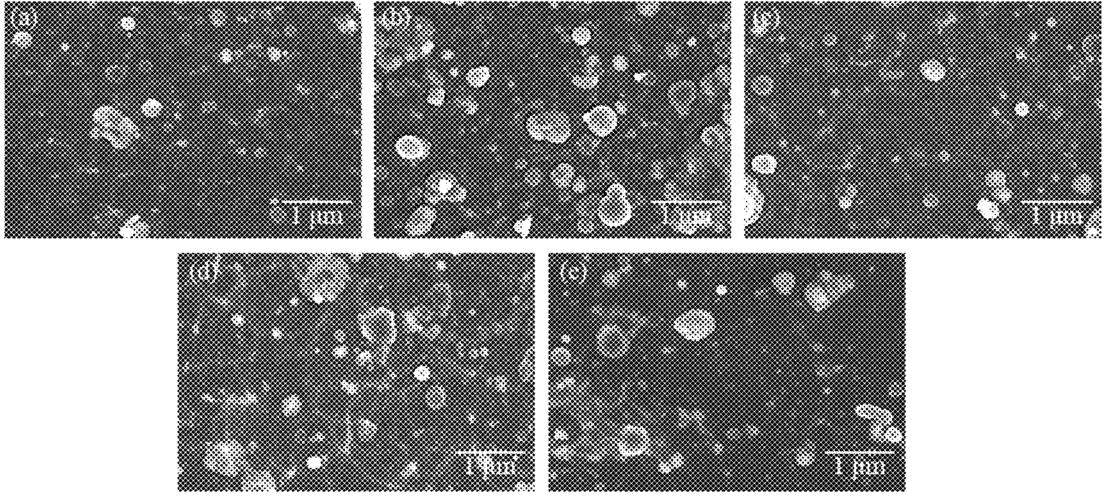
FIG. 1 shows the surface morphology of embodiment 1 AlCrVTiSiON gradient coatings with different surface oxygenation times prepared by arc ion plating technology. Where: (a) oxygen ventilation time 0 min; (b) Oxygenation time 5 min; (c) Oxygenation time 10 min; (d) Oxygenation time 15 min; (e) Oxygenation time 20 min.

The invention is further explained by embodiments below.

In the following embodiments, the atomic ratio of Al, Cr and Si elements in the AlCrSi target is 6:3:1, and the atomic ratio of Al, Ti and Si elements in the AlTiSi alloy target is 6:3:1.

Embodiment 1

In this embodiment, the AlCrVTiSiON nano-gradient coating with different oxygen time on the surface is prepared, and five kinds of coatings are prepared in total. Specifically, when the AlCrVTiSiON coating is deposited, the oxygen time on the surface is 0 min, 5 min, 10 min, 15 min and 20 min respectively. The specific preparation process of the coating is as follows:

In this embodiment, the AlCrVTiSiON coating is deposited on a single crystal Si sheet (40 mm×40 mm×0.67 mm), a cemented carbide sheet (25 mm×25 mm×3.0 mm) and a stainless steel sheet (35 mm×35 mm×1.0 mm), and is coated by arc ion plating technology. The specific steps are as follows:

(1) After polishing the cemented carbide substrate, in order to ensure a good combination between the coating and the substrate, all the substrates are cleaned for 15 min by ultrasonic cleaning machine using degreaser, acetone and anhydrous ethanol solution after finishing the grinding and polishing process, so as to maximize the binding force between the coating and the substrate. Then, after drying with high purity nitrogen, the treated substrate is hung on the sample rack in the furnace. This step not only helps to further remove moisture and organic matter that may remain on the substrate surface, but also creates an ideal surface environment for subsequent coating processes. The matrix is fixed on the sample rack, and the AlCrSi, AlTiSi alloy target, metal V target and Cr target are connected with the arc ion plating cathode. The jig position is adjusted and the furnace door closed.

(2) Vacuum extraction: open the mechanical pump, rough extraction valve, maintenance pump and maintenance valve in turn, when the vacuum degree of the front stage is less than 4 Pa, open the molecular pump climb. When the pressure in the furnace is lower than 4 Pa, close the crude pumping valve and open the high valve fine pumping. The pressure in the furnace is first pumped to 5×10−3 Pa, turn on the forward rotation and heating, the rotating frequency is 40 Hz, the heating temperature is 450° C., the pressure in the furnace is lower than 3×10−3 Pa, and the temperature can reach the set temperature to start the experiment.

(3) Glow discharge vacuum chamber: Open the Ar cylinder, set the gas flow to 400 sccm, adjust the throttle valve to keep the working pressure at 2.4 Pa, set pulse bias −800 V, frequency 10 kHz, pulse width 6 μs (duty cycle 94%), glow time 20 min;

(4) Cleaning the surface of the target: first turn off the bias, then set the Ar gas flow to 100 sccm, adjust the working pressure to keep at 0.5 Pa, open the Cr target, and the Cr target current is 90 A; The pulse bias is −800 V, −600 V, −400 V and −200V respectively for 2 min, with a frequency of 10 kHz and a pulse width of 6 μs (duty cycle 94%).

(5) Sedimentary transition layer: Turn off the target power supply and bias voltage successively, open the $N_2$ gas cylinder, the argon gas and nitrogen flow rate are 50 sccm and 200 sccm respectively, adjust the working pressure to keep at 1 Pa, pulse bias voltage −100 V, frequency 50 kHz, pulse width 8 μs (duty cycle 60%), open the Cr target to deposit the CrN transition layer, and take the Cr target current as 90 A. Deposition time 15 min.

(6) When preparing AlCrVTiSiON nano-gradient coating, turn off the Cr target power supply and bias voltage successively, argon 50 sccm, nitrogen 600 sccm, adjust the working pressure to maintain 2.8 Pa, pulse bias amplitude −100 V, frequency 50 kHz, pulse width 6 μs, turn on AlCrSi target, AlCrSi target current is 100 A. Open the AlTiSi target, the AlTiSi target current is 80 A, V target current is manually adjusted during the coating process to prepare gradient coating, V target current is gradually increased from the lower limit of 75 A to the upper limit of 90 A, 12 sccm oxygen is fed in the last 0 min, 5 min, 10 min, 15 min and 20 min of coating deposition. The total deposition time of AlCrVTiSiON gradient coating is 180 min.

The morphologies and properties of AlCrVTiSiON nano-gradient coatings with different surface oxygenation times prepared in this embodiment were characterized as follows:

The surface and cross section morphology of the coating were observed by HitachiS-4800 field emission scanning electron microscope (SEM). The phase composition of the coating was analyzed by BruckerD8-Discovery X-ray diffractometer (XRD). The monochromatic Kα radiation of Cu target (λ=0.15418 nm) was selected. The spectra were recorded at a scan rate of 0.02°/s in the diffraction Angle range of 25 to 80° (2θ). In accordance with ISO 14577 standard, Anton Paar TTX-NHT3 nanoindentation instrument was used to test the hardness and elastic modulus of the three coatings respectively. In the test, Pokvig diamond indenter with a top Angle of 142.3° was used to apply load to the coatings, pressing depth of 200 nm and holding pressure time of 10 s. Two groups were tested for each sample. Each group tested 10 points and averaged them. According to ISO 20502 standard, Anton Paar RST-3 scratch meter was used to test the critical load of different coatings. The diameter of spherical diamond tip was 200 μm, the load gradually increased from 1 N to 100 N, the scratch length was 3 mm, and the scratch rate was 6 mm/min. Each sample was tested three times to take the average value. The Anton Paar THT high-temperature friction and wear testing machine was used to detect the friction coefficient of the coating. $Al_2O_3$ balls with a diameter of 6 mm were selected for the friction pair, and the normal load was 4 N. Each sample was tested three times. The radius of the wear mark was 4 mm, 6 mm and 8 mm, and the number of friction rings was 3000. After the friction experiment, the Contour GT-K white light interferometer was used to observe the wear morphology of the coating, and the wear rate of the coating was calculated by the formula.

FIG. 1 shows the surface morphology of AlCrVTiSiON gradient coatings with different surface oxygen aeration times. With the increase of oxygen aeration time, the large particles on the surface of the coatings show a trend of decreasing first and then increasing. Compared with AlCrVTiSiN coating, the number of large particles on the surface increased after oxygenation. This is due to the reduction of the active region on the surface of the target and the increase of the arc current density, resulting in the formation of aggregates on the coating surface of larger molten liquid, and these particles on the surface of the film are emitted from the tiny melting region of the low melting point of the target. On the other hand, during the oxygenation process, oxygen atoms may chemically react with metal elements on the surface of the coating (such as Al, Cr, V, Ti, etc.) to form oxides. These oxides may precipitate on the surface in the form of particles, forming a granular structure. The densest surface of AlCrVTiSiN coating was obtained when the surface layer of Alcrvtisin coating was oxygenated for 10 min, which was attributed to the fact that the oxide formed a dense oxide layer on the surface of the coating and filled the pores and voids that might exist in the original coating, thus improving the density of the surface. In the case of short oxygen passage time, a more uniform and dense oxide layer may be formed, which inhibits the formation of large particles. The extension of oxygen release time may lead to more oxidation reactions, forming granular oxides, which increases the number and size of particles.

Figure 2:
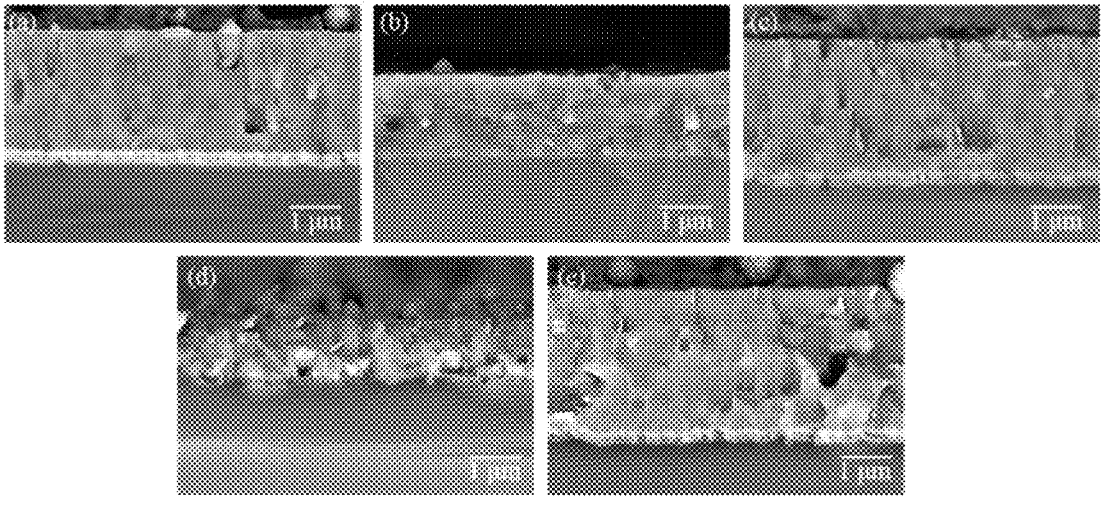
FIG. 2 shows the cross section morphology of the gradient/AlCrVTiSiON coating prepared by the electroionization plating technique at different oxygenation times. Wherein: (a) oxygenation 0 min; (b) Oxygen for 5 min; (c) Oxygenate for 10 min; (d) Oxygen for 15 min; (e) Oxygenate for 20 minutes.

FIG. 2 shows the cross section morphology of AlCrVTiSiON coating with different surface oxygenation times. With short oxygenation time, due to the close proximity of the two layers of elements, the interface of the oxide layer is not clear. When the oxygenation time is 10 min, the cross section of the coating is relatively flat, and the amount of Mosaic particles is the least. In contrast, holes formed by particle shedding were observed in coating sections under other oxygenation time conditions. This phenomenon may be related to the oxidation reaction caused by oxygen treatment and its effect on the coating structure. In the case of short oxygen passage time, the oxide layer formed on the coating surface is relatively uniform, which can effectively fill the gap between the surface particles, so that the cross section is relatively smooth. However, with the extension of oxygenation time, the oxidation reaction may cause the particles to fall off and form holes, and the coating thickness also shows an obvious decreasing trend. It is worth noting that the coating thickness is dramatically reduced when the oxygen time is 5 min and 15 min, and even half of the coating thickness is reduced when the oxygen time is 10 minutes. At the same time, the interlayer interface is not clear enough, which may cause the structural change of the coating due to excessive oxidation reaction.

Figure 3:
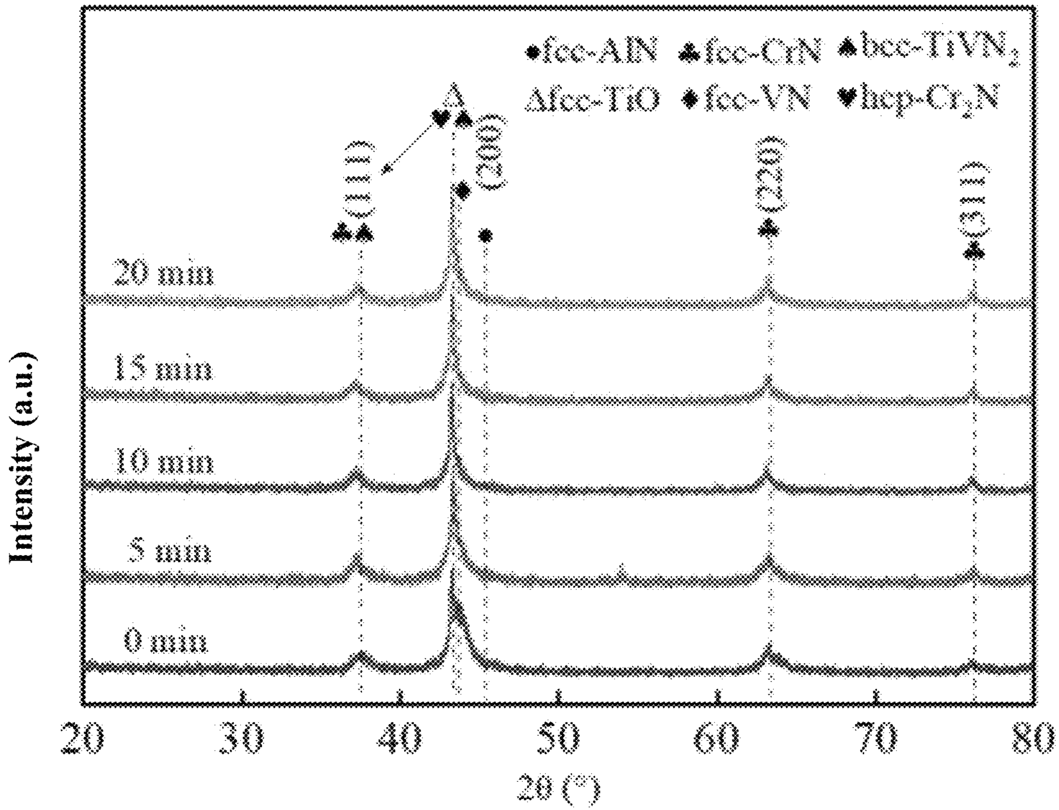
FIG. 3 shows the XRD pattern of Embodiment 1 AlCrVTiSiON gradient coatings with different surface oxygenation times prepared by arc ion plating technology.

FIG. 3 shows the XRD pattern of AlCrVTiSiON coating with five different surface oxygenation times. The five coatings are mainly face-centered cubic structure, and the different oxide thickness has little effect on the phase structure of the coating. In contrast to AlCrVTiSiN gradient coating, AlCrVTiSiON gradient coating detects the bcc-$TiVN_2$(PDF #89-5212) phase diffraction peak formed by V atom dissolved in TiN at $2\theta=37.19°$. Moreover, the diffraction peak of fcc-TiO(PDF #89-5010) phase was detected at $2\theta=43.27°$, but no $TiO_2$ diffraction peak was detected, which may be attributed to the coating deposition temperature of 450° C., at which TiO is more easily formed. Since no silicon nitride peak was detected, it may exist as amorphous silicon nitride. In the case of AlCrVTiSiN gradient coating, silicon mostly exists as amorphous $Si_3N_4$, forming a nanocomposite coating structure. When oxygen is introduced into the deposition process, silicon is more likely to react with oxygen first because $\Delta H(SiO_2)=-910.86$ KJ/mol is higher than $\Delta H(Si_3N_4)=-760.00$ KJ/mol. $SiO_2$ is formed.

Figure 4:
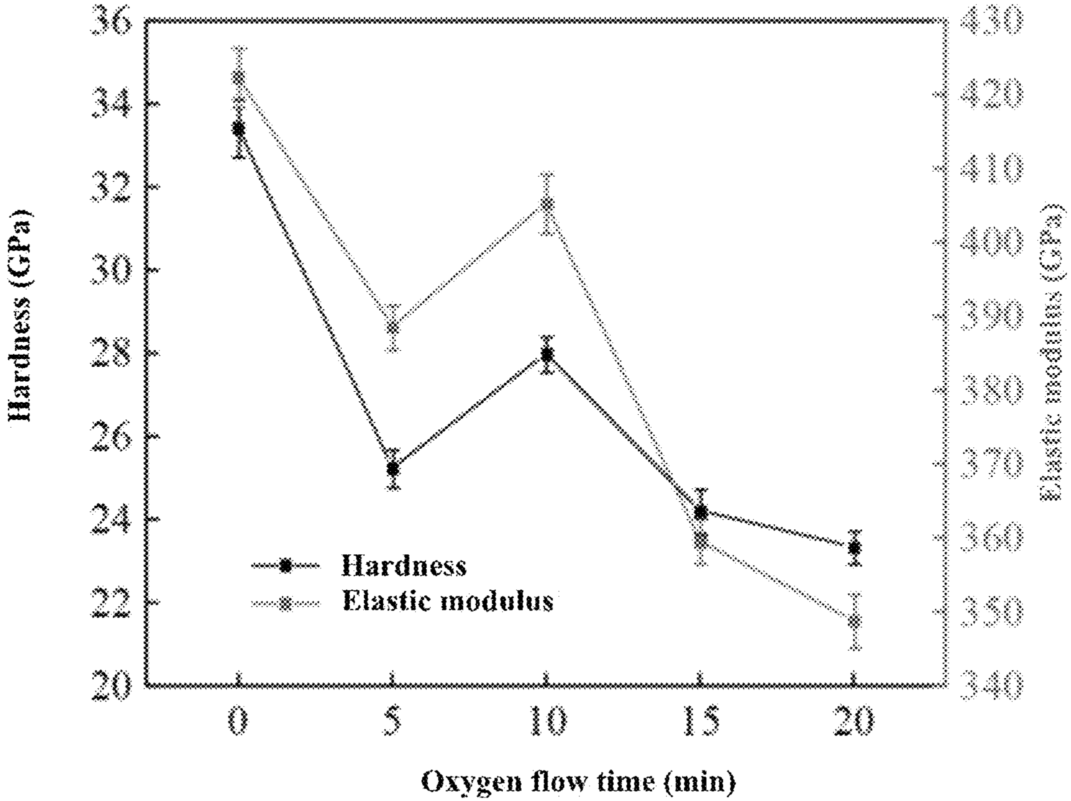
FIG. 4 shows the hardness and elastic modulus of the AlCrVTiSiON gradient coating prepared by arc ion plating technology for different surface oxygenation times in Embodiment 1.

FIG. 4 shows the changes of hardness and elastic modulus of five AlCrVTiSiON nano-gradient coatings with different oxygen ventilation times, all of which showed a trend of first increasing and then decreasing. The hardness of the coating decreased from 33.4 GPa of the AlCrVTiSiN coating when the oxygenation time was 0 to 23.3 GPa of the surface oxygenation time of 20 min. The hardness and elastic modulus reached the maximum value when the surface was oxygenated for 10 min, which were 28.0 GPa and 405.3 GPa respectively. AlCrVTiSiON coating will soften with the increase of oxygenation time, which is due to the increase of oxide quantity and the relaxation of the inherent compressive stress caused by oxygen incorporation. After O element doping, the hardness and elastic modulus of the coating increases first and then decreases. O element doping results in the formation of brittle oxide film on the coating surface, which results in the decrease of hardness and elastic modulus. When oxygenated for 5 minutes, the film formed along the growth direction of the coating was not dense enough. When oxygenated for 10 min, the oxide layer can form a dense $(Al,Cr)_2O_3$ and $V_2O_5$ oxide film protective coating on the surface of the coating while maintaining the hardness of the AlCrVTiSiN functional layer, preventing the propagation of microcracks. With the further increase of oxygenation time, the thickness of the oxide film on the coating surface increases, resulting in a sharp decrease in the hardness and elastic modulus of the coating. In addition, it may be caused by vacancies in the cubic lattice, and these vacancy defects may lead to reduced indentation hardness and modulus when the oxygen passage time is increased.

Figure 5:
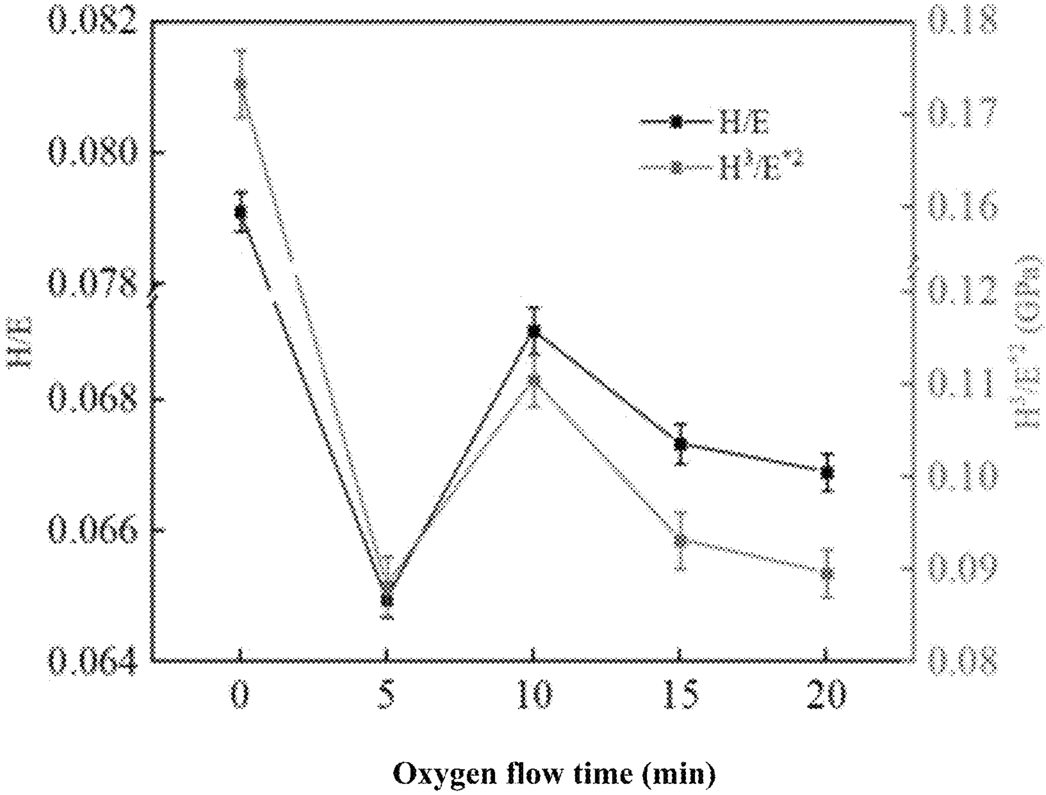
FIG. 5 shows the H/E and $H^3/E^{*2}$ of the AlCrVTiSiON gradient coatings with different surface oxygenation times prepared by arc ion plating technology in example 1.

FIG. 5 shows the H/E and $H^3/E^{*2}$ variations of five AlCrVTiSiON gradient coatings with different oxygen aeration times. The higher the ratio of hardness to elastic modulus, the better the wear resistance of the coating, and the ratio of $H^3/E^{*2}$ represents the ability of the coating to resist plastic deformation. With the increase of surface oxygenation time, the characteristic value of AlCrVTiSiON gradient coating increases first, and reaches the maximum value at 10 min oxygenation time, which is 0.069 and 0.111 GPa respectively, which is higher than that of AlCrVTiSiON coating prepared at other oxygenation time. Due to the periodic bombardment of high-energy ions during the deposition process, the crystal size is smaller, which also enhances the plastic deformation resistance of the coating, and the external force can be dispersed to a larger volume, effectively reducing the accumulation of internal stress of the coating. In addition, the amorphous nanocrystalline structure formed in the coating also improves the toughness and strength of the coating. The characteristic value of the coating is the lowest when the surface is oxygenated for 15 min, and the toughness and fracture toughness of the coating are the worst. The characteristic value of AlCrVTiSiON gradient coating increased again when the oxygenation time was extended to 20 min, which may be attributed to the increase of $V_2O_5$ film thickness on the surface of the coating, resulting in the enhancement of the toughness of the coating.

Figure 6:
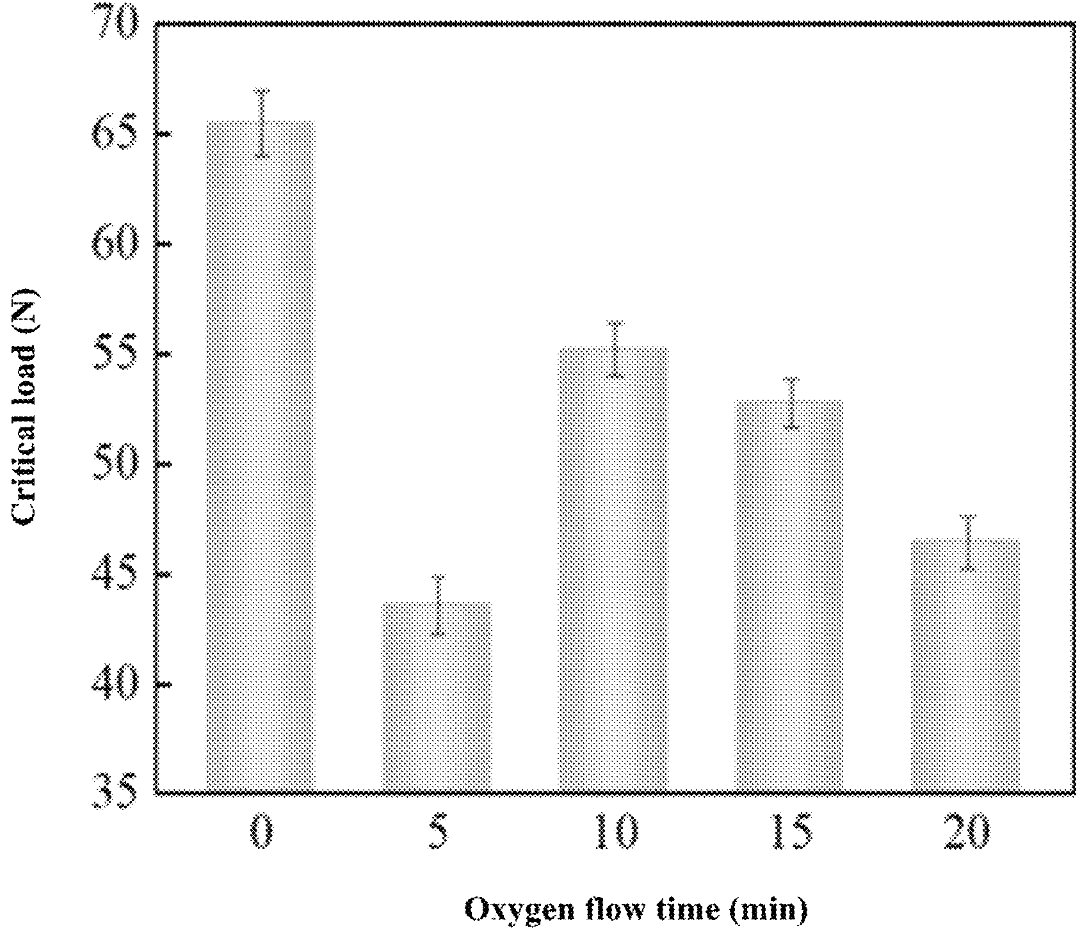
FIG. 6 shows the critical load of the AlCrVTiSiON gradient coating with different surface oxygenation times prepared by the arc ion coating technology in example 1.

FIG. 6 shows the change of critical load of AlCrVTiSiON gradient coating. With the increase of oxygen passage time, the critical load first increases and then decreases. When the surface layer was oxygenated for 5 min, the binding strength of the coating film/base was the worst (43.6 N). When the surface oxygenation time is 10 min, the critical load of the coating reaches the maximum value of 55.2 N, and cracks occur at the scratch boundary, and there are shell cracks and plastic deformation at the edge of the scratch track of the coating. At the beginning of the scratch experiment, the critical load is mainly affected by the pinhead compressive stress, and the formation of such surface cracks is caused by the tensile stress at the indenter. With the further increase of oxygen time, a thicker oxide layer may be formed on the coating surface. The increase of these oxide layers may lead to an increase in the surface roughness of the coating, which affects the bonding between the surface layer of the coating (formed after oxygenation) and the AlCrVTiSiN functional layer (formed before oxygenation), resulting in a weakening of the bonding force between the coating and the substrate. In addition, extending the oxygenation time may cause more oxidation reactions to occur at the interface between the coating and the substrate. These interfacial reactions may change the chemical composition and structure of the surface, resulting in a change in the nature of the interaction between the coating and the substrate, which in turn affects the binding force.

Figure 7:
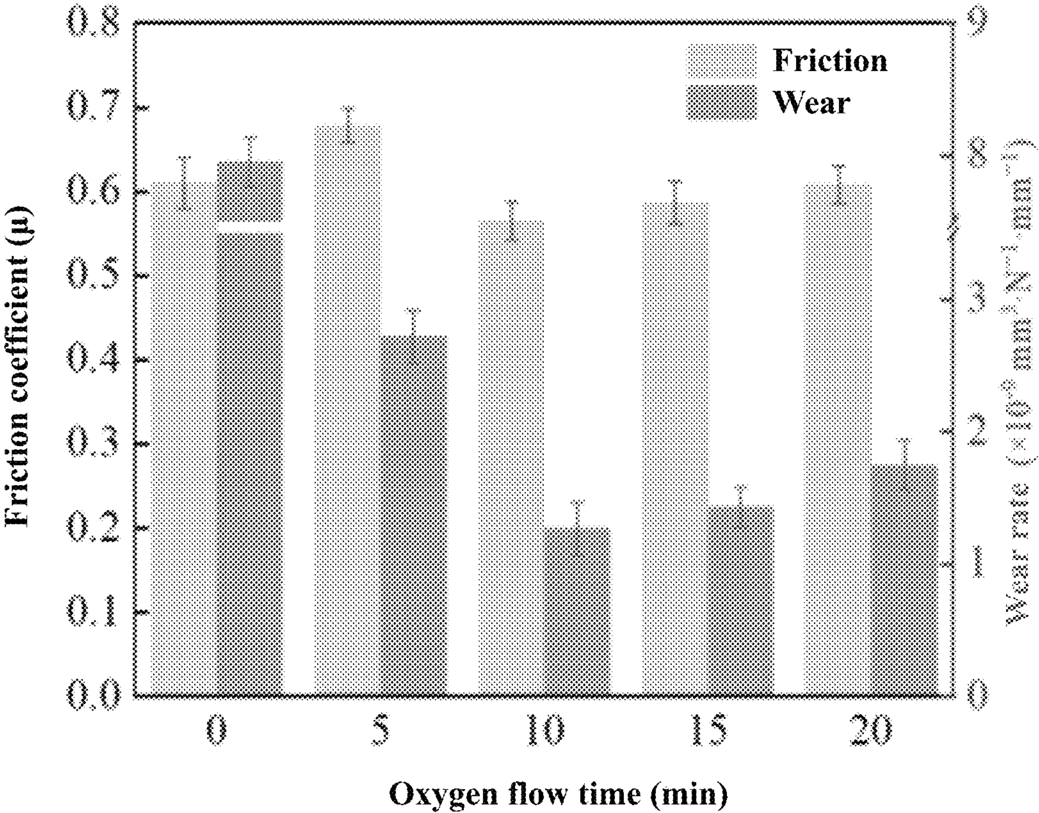
FIG. 7 shows the friction coefficient and wear rate of the AlCrVTiSiON gradient coating with different surface oxygenation times prepared by the arc ion coating technology in example 1.

FIG. 7 shows the variation of friction coefficient and wear rate of AlCrVTiSiON coating with five different oxygen ventilation times. The average friction coefficient of AlCrVTiSiON coating is significantly lower than that of AlCrVTiSiN coating formed without oxygen, which is attributed to the formation of Magneli oxide films such as $V_2O_5$ on the surface of the coating during friction. In addition, the content of oxide on the surface of the coating increases due to the doping of O element during the coating process. $VO_x$ lubrication phase oxide is formed on the surface of the coating, which significantly reduces the friction coefficient and wear rate. The main wear mechanisms are abrasive wear, adhesive wear and oxidation wear. The friction coefficient and wear rate decreased first and then increased. The average friction coefficient and wear rate reached the minimum values when the surface was oxygenated for 5 min, which were 0.56 and $1.27\times10^{-9}$ $mm^3\cdot N^{-1}\cdot mm^{-1}$, respectively. In this case, the surface oxide content of the coating was moderate and the wear resistance of the coating was the best. The friction coefficient and wear rate increased with the further increase of the oxygen oxygenation time of the surface layer, which was attributed to the rapid growth of porous brittle $TiO_2$ on the surface of the coating, and its formation was related to the residual stress in the coating, which deteriorated the $Al_2O_3$ protective layer, and the Magneli phase oxides such as $V_2O_5$ in the coating were insufficient to sustain the supply, reducing the wear resistance of the coating. In addition, hardness has always been considered to determine the main property of wear resistance, the higher the hardness of the coating, usually the better the corresponding wear resistance. The thickening of the oxide layer may change the interface bonding between the coating and the substrate, considering the change of coating bonding force at different oxygenation times. The formation of the oxide layer when the surface is oxygenated for 5 minutes may help to improve the binding force between the coating and the substrate and reduce friction and wear. However, excessive thickening of the oxide layer may lead to weakening of the interface bond, resulting in loss and damage of the coating, causing the friction coefficient and wear rate to increase again.

Figure 8:
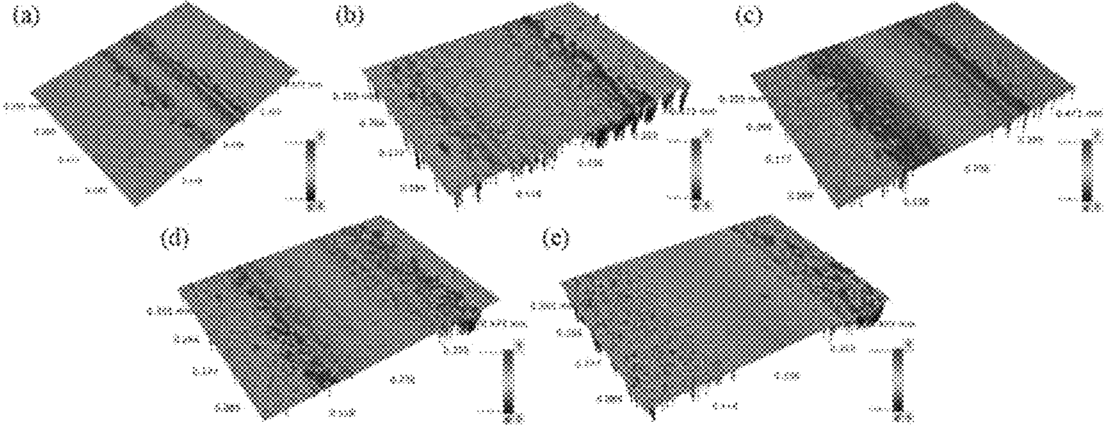
FIG. 8 shows the 3D wear morphology of AlCrVTiSiON gradient coatings prepared by electric arc ionization plating technology at different oxygenation times. Wherein: (a) oxygenation 0 min; (b) Oxygen for 5 min; (c) Oxygenate for 10 min; (d) Oxygen for 15 min; (e) Oxygenate for 20 minutes.

FIG. 8 shows the three-dimensional wear morphology of AlCrVTiSiON coating with five different surface oxygenation times. The wear surface is relatively smooth, and there is some adhesive debris on the wear surface, which means that the wear mechanism is mainly oxidative wear and slight adhesion wear. In the three-dimensional wear marks morphology, the wear marks are the narrowest and shallowest when the surface layer is oxygenated for 10 min. Combined with the XRD pattern, a relatively uniform and stable oxide layer structure is formed in the coating, which can reduce the spalling and wear during friction. In addition, combined with the surface topography, it can be seen that the surface oxygenation for 10 minutes may be conducive to the formation of a smooth and dense surface structure, reducing the surface roughness and friction coefficient, and thus slowing down the wear process. As the surface oxygenation time increases, the wear trajectory of the AlCrVTiSiN/AlCrVTiSiON double layer coating becomes wider and deeper, which means that the wear resistance is reduced. After oxygenation for 20 minutes, holes appear in the wear marks, which may be caused by the presence of large particles in the coating, and the large particles fall off during the interaction between the coating and the friction pair. This observation is consistent with SEM images of the coating surface, indicating a potential correlation with the presence of a large number of particles on the coating surface.

Figure 9:
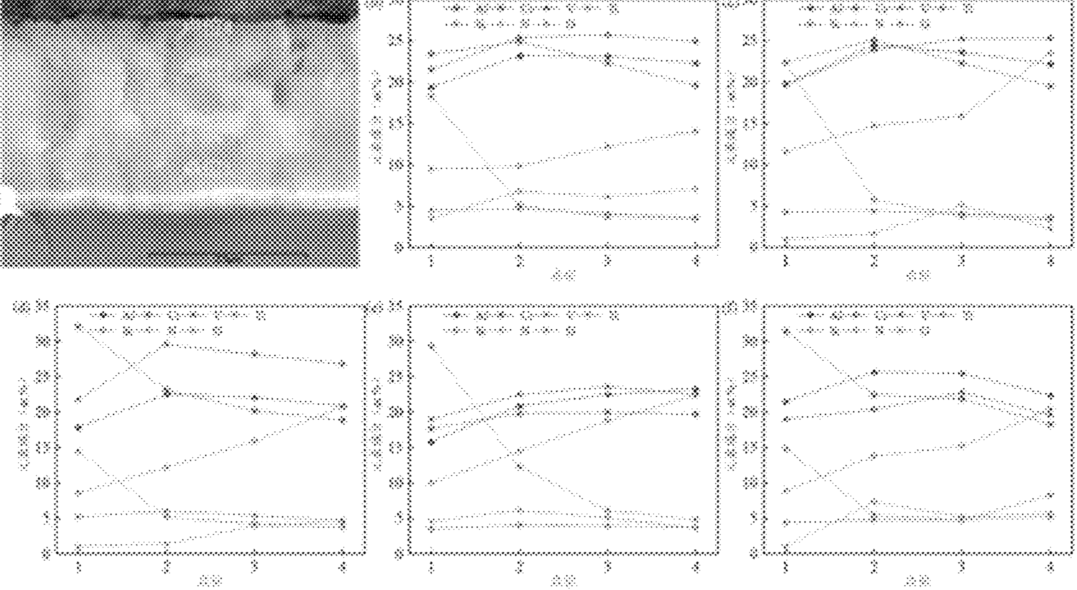
FIG. 9 shows the composition of AlCrVTiSiON gradient coatings prepared by electric arc ionization plating technology at different oxygenation times. Where: (a) test point; (b) Oxygen for 0 min; (c) Oxygen for 5 min; (d) Oxygenate for 10 min; (e) Oxygenation for 15 min; (f) Oxygenate for 20 minutes.

FIG. 9 shows the composition of AlCrVTiSiON gradient coatings with different surface oxygenation times prepared in this embodiment. Among them: FIG. 9(*a*) is the schematic diagram of the coating test points. The corresponding component data are shown in Table 1 below.

TABLE 1

AlCrVTiSiON gradient coating Composition with different surface oxygenation times (wt. %)

| Time | Element | | | | | | |
|---|---|---|---|---|---|---|---|
| | Al | Cr | V | Ti | Si | N | O |
| 0 min | 19.4 | 23.4 | 21.5 | 4.5 | 18.3 | 3.5 | 9.5 |
| | 23.2 | 24.9 | 25.4 | 4.7 | 5.1 | 6.8 | 9.8 |
| | 23.1 | 22.3 | 25.7 | 4.1 | 3.7 | 6.1 | 12.2 |
| | 22.3 | 19.6 | 24.9 | 3.6 | 3.5 | 7.1 | 14.1 |
| 5 min | 19.8 | 22.4 | 19.7 | 4.3 | 22.3 | 1.0 | 11.6 |
| | 24.5 | 25.1 | 23.9 | 4.4 | 5.8 | 1.7 | 14.7 |
| | 23.6 | 22.3 | 25.2 | 4.1 | 3.8 | 5.1 | 15.9 |
| | 22.2 | 19.5 | 25.3 | 3.7 | 3.4 | 2.3 | 23.5 |
| 10 min | 17.9 | 32.1 | 21.8 | 5.2 | 14.5 | 1.0 | 8.6 |
| | 22.5 | 23.1 | 29.6 | 6 | 5.2 | 1.4 | 12.2 |
| | 22.1 | 20.2 | 28.2 | 5.4 | 4.2 | 3.9 | 15.9 |
| | 20.9 | 18.9 | 26.8 | 4.7 | 4.3 | 3.7 | 20.8 |
| 15 min | 15.9 | 17.7 | 19 | 3.5 | 29.3 | 4.6 | 10 |
| | 20.9 | 19.8 | 22.5 | 4.0 | 12.3 | 6.1 | 14.5 |
| | 22.5 | 20 | 23.6 | 3.9 | 6.1 | 5.1 | 18.8 |
| | 23.3 | 19.7 | 22.5 | 3.7 | 4.8 | 3.6 | 22.4 |
| 20 min | 21.5 | 31.4 | 19 | 4.4 | 14.8 | 1 | 8.9 |
| | 25.7 | 22.4 | 20.4 | 4.8 | 5.5 | 7.3 | 13.8 |
| | 25.5 | 21.9 | 22.8 | 4.7 | 4.8 | 5.2 | 15.2 |
| | 22.4 | 18.3 | 19.6 | 8.3 | 5.2 | 5.7 | 20.4 |

It can be seen from FIG. 9 and Table 1 that in the AlCrVTiSiON gradient coating prepared in this embodiment, the O element in each coating gradually increases from the inside to the outside. With the increase of oxygen time, the O content in the coating first increases and then decreases. Although the V target power increases linearly during the deposition process, the V content in the coating changes to a certain extent but does not gradually increase with the increase of the power.

The above is an illustrative description of the invention, and it should be stated that, without deviating from the core of the invention, any simple deformation, modification, or other equivalent substitution which a person skilled in the art can make without creative labor falls within the scope of protection of the invention.

What is claimed is:

1. A method for preparing surface oxygenated AlCrVTiSiON nano-gradient coatings, the surface oxygenated AlCrVTiSiON nano-gradient coating being deposited on a metal or silicon substrate, having an oxygen content that gradually increases from inside to outside, and having a coating surface comprising a protective layer of AlCrVTiSiON oxide, wherein: the AlCrVTiSiON nano-gradient coating is deposited on a substrate by an arc ion plating process;

the V content of the AlCrVTiSiON nano-gradient coating is controlled by linear adjustment of a V target current, and the AlCrVTiSiON nano-gradient coating is formed by surface oxygenation;

wherein targets utilized for the arc ion plating process are selected from: AlCrSi, AlTiSi alloy and V target and Cr target;

a metal compound CrN transition layer is deposited on the substrate for 15~20 min, and then an AlCrVTiSiN functional layer is deposited and surface oxygenated;

during deposition of the AlCrVTiSiN functional layer and surface oxygenation, a background vacuum is above $3\times10^{-3}$ Pa, a bias is −100~−110 V, a duty cycle of 50%~60%, a deposition pressure is 2.8-2.9 Pa, and the AlCrSi target, AlTiSi target and V target are utilized;

the target currents of the AlCrSi and AlTiSi targets are kept constant, the range of the AlCrSi target current is 95-100 A, and the range of AlTiSi target current is 80-85 A;

wherein the V target current increases linearly from a lower limit of 75 A to an upper limit of 95 A, utilizing Ar and $N_2$;

wherein, according to a thickness of a required AlCrVTiSiON nano-gradient coating and the target current, a set time is utilized for the currents, the targets and for a gas inlet, and oxygen is injected into the AlCrVTiSiN functional layer within the last 5-20 minutes of deposition to implement surface oxygenation to form the AlCrVTiSiON nano-gradient coating.

2. The method for preparing surface oxygenated AlCrVTiSiON nano-gradient coatings described in claim 1, wherein: a flow rate of Ar is 50-60 sccm, a flow rate of $N_2$ is 590-600 sccm, a total gas flow rate is 650 sccm, and the bias is −100~−110V;

wherein, in surface oxidation, a gas flow rate of oxygen is 10-15 sccm, and an oxygen time is 5-20 min;

wherein, during deposition of the AlCrVTiSiON nano-gradient coating, the hardness and elastic modulus of the AlCrVTiSiON nano-gradient coating first increase with the increase of oxygen passage time and then decrease with the increase of oxygen passage time, and the friction coefficient and wear of the AlCrVTiSiON nano-gradient coating first decrease and then increase.

3. The method for preparing surface oxygenated AlCrVTiSiON nano-gradient coatings of claim 1, wherein the method comprises the following steps:

(1) a cleaned substrate is fixed on a rotating frame in a coating room, and a vacuum degree is pumped to more than $3\times10^{-3}$ Pa; AlCrSi, AlTiSi alloy targets, V targets, Cr targets are used as arc ion plating cathode targets;

(2) the substrate is cleaned by glow discharge and ion bombardment successively;

(3) the CrN transition layer is deposited to improve the bonding strength between a working layer and the substrate;

(4) the AlCrVTiSiN functional layer is deposited;

(5) the AlCrVTiSiON protective layer is deposed.

4. The method of preparing surface oxygenated AlCrVTiSiON nano-gradient coating of claim 3, wherein: in step (2), the glow discharge cleaning uses an Ar gas flow set to 400-410 sccm, a working pressure adjusted to 2.4-2.5 Pa, a pulse bias set to −800~−750 V, a duty cycle of 94-96%, and a glow time of 15-20 min;

the ion bombardment cleaning is as follows: after glow discharge cleaning, the pulse bias is turned off, Ar gas flow rate is set to 100-110 sccm, working pressure is adjusted to 0.5-0.6 Pa, and the Cr target is utilized;

wherein, during the ion bombardment cleaning the pulse bias voltage is −800 V, −600 V, −400 V, and −200 V, respectively, with a duty cycle of 94-96%, for 2 minute washes each and a 90-95 A Cr target current.

5. The method of preparing surface oxygenated AlCrVTiSiON nano-gradient coatings described in claim 3, wherein: in step (3), the depositing of the CrN transition layer includes:

turning off a Cr target power supply and bias voltage, opening a $N_2$ gas cylinder, setting argon and nitrogen flow rates of 50-60 sccm and 190-200 sccm respectively, adjusting a working pressure to maintain 1.0-1.1 Pa, a pulse bias of −100~−90 V, a duty cycle of 60%, utilizing the Cr target to deposit the CrN transition layer, utilizing a Cr target current of 90-95 A;

wherein a deposition time of the CrN transition layer is 15-20 min.

* * * * *